(12) United States Patent
Aoki

(10) Patent No.: US 6,839,282 B2
(45) Date of Patent: Jan. 4, 2005

(54) SEMICONDUCTOR NONVOLATILE MEMORY FOR PERFORMING READ OPERATIONS WHILE PERFORMING WRITE OPERATIONS

(75) Inventor: Hajime Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 91 days.

(21) Appl. No.: 10/278,812

(22) Filed: Oct. 24, 2002

(65) Prior Publication Data

US 2003/0151951 A1 Aug. 14, 2003

(30) Foreign Application Priority Data

Feb. 14, 2002 (JP) .......................................... 2002-036109

(51) Int. Cl.$^7$ ............................................. G11C 16/04
(52) U.S. Cl. ............................ 365/185.22; 365/185.2; 365/185.21
(58) Field of Search ......................... 365/185.22, 185.2, 365/185.21, 185.01

(56) References Cited

U.S. PATENT DOCUMENTS 5,408,432 A * 4/1995 Watanabe ............... 365/185.21
6,016,560 A * 1/2000 Wada et al. ................ 714/718

* cited by examiner

Primary Examiner—Hoai Ho
(74) Attorney, Agent, or Firm—Arent Fox, PLLC

(57) ABSTRACT

A semiconductor nonvolatile memory in which read operations are carried out during write operations, includes: a core having a plurality of cell transistors for storing data; and a write verify circuit for detecting change in a core cell transistor's characteristic during a write operation in which the gate voltage/drain current characteristic of the cell transistor is changed to a condition corresponding to stored data by injecting a charge into or extracting a charge from the core cell transistor; and further includes a write verify inhibition signal generation circuit for generating a write verify inhibition signal in order to deactivate the write verify circuit during a read operation to the core cell transistor. The generation of a mistaken verify decision by the write verify circuit, due to a change in the power supply potential accompanying large current during a read operation, is prevented, as is malfunction of the write verify.

11 Claims, 7 Drawing Sheets

SEMICONDUCTOR NONVOLATILE MEMORY FOR PERFORMING READ OPERATIONS WHILE PERFORMING WRITE OPERATIONS

BACKGROUND OF THE INVENTION

1. Field of the Invention

The present invention relates to a semiconductor nonvolatile memory such as flash memory, and more particularly, to a nonvolatile memory that is able to perform write (program and erase) and read operations at the same time.

2. Description of the Related Art

Flash memory that uses semiconductor nonvolatile memory is widely used in mobile information terminals, mobile phones and the like because stored data is not lost when the power is off. This nonvolatile memory stores data by setting the gate voltage/drain current characteristic of the transistor at different levels, depending on whether or not the charge is stored in the floating gate or trap gate of a transistor which is formed on the surface of the semiconductor substrate.

In a data write operation this nonvolatile memory comprises a program operation to inject a charge into the floating gate or trap gate and raise the transistor's threshold voltage, and conversely an erase operation to extract the charge and lower the transistor's threshold voltage. The nonvolatile memory, by applying applies to the gate a voltage which is intermediate to the above two threshold voltages, reads the written data according to the value of the drain current flowing in the cell transistor.

Consequently, in a read operation, a prescribed read voltage is applied to the gates of a core cell transistor and a reference cell transistor, and the difference in the voltage level corresponding to the drain current flowing to both transistors is detected by a sense amplifier. A charge is fed into a reference transistor so that the cell transistor has the intermediate threshold voltage between data "1" and "0". Then, when applying the read voltage to both transistors, data can be detected according to whether the drain current of the core cell transistor is higher or lower than the drain current of the reference cell transistor.

Further, in a write operation, when programming from a data "1" condition at a low threshold voltage to a data "0" condition at a high threshold voltage by injecting a charge, a program verify is performed to determine whether or not the threshold voltage of the cell transistor has become sufficiently high. This program verify is a read operation using a reference cell transistor for programming. In other words, in this operation, program verify voltage is applied to both the reference cell transistor for programming and the core cell transistor, and the difference in the voltage level corresponding to the drain currents of both transistors is detected by the sense amplifier.

Further, in a write operation, when erasure is carried out from a data "0" condition at a high threshold voltage to a data "1" condition at a low threshold voltage by extracting a charge, an erase verify is performed to determine whether or not the threshold voltage of the cell transistor has become sufficiently low. This erase verify is also a read operation using a reference cell transistor for erasure. In other words, in this operation, erase verify voltage is applied to both the reference cell transistor for erasure and the core cell transistor, and the difference in voltage level corresponding to the drain currents of both transistors is detected by the sense amplifier.

In flash memory that uses conventional nonvolatile memory, performing a read operation at the same time as a write operation is not permitted. Therefore, a read operation request made during programming or erasure is denied. However, if a read request is made during sector erasure, as an exception, a special mode is sometimes installed that allows the erase operation to be interrupted and the read request to be accepted. Even in such a case, the erase operation and the read operation are not performed simultaneously.

However, flash memory that is able to accept a read operation during a write operation to a cell inside a chip, and perform read operations and write operations at the same time, has been proposed. For example, a construction exists whereby a plurality of memory banks are provided in the memory core of a chip, a memory cell array and row/column decoders are provided in each memory bank, and write operations and read operations are controlled for each bank. In such a construction, when one memory bank is performing a write operation, another memory bank can perform a read operation.

However, the inventors of the present invention have discovered that in this kind of flash memory that performs write operations and read operations at the same time, due to operations accompanying the read operation which use a large electric current, there is the possibility of a malfunction occurring in the verify operation for the write operation.

FIG. 1 is a schematic circuit diagram of a core cell transistor, a reference cell transistor and a sense amplifier. Further, FIG. 2 is a view explaining the erase verify and the program verify.

As shown in FIG. 1, in the read verify circuit and the write verify circuit, a current path of a core cell transistor C-CEL and a current path of a reference cell transistor Ref-CEL are formed between power supply pads 10 and 12 for the power supply Vcc and the ground Vss, provided inside the chip. The difference in voltage between a node N1 and a node N2 in these current paths is detected by a sense amplifier 14. In other words, the same voltage is applied to the gates WLc and WLref of both cell transistors, and voltage is generated in the nodes N1 and N2 by the drain current flowing to the core cell transistor C-CEL and the drain current flowing to the reference cell transistor Ref-CEL. Then, the difference in voltage of the nodes N1 and N2 is detected by the sense amplifier 14.

Further, inside the current path of the core cell transistor C-CEL, parasite resistance and capacity, and other circuit resistance and capacity RCa-c and RCb-c exist. Similarly, inside the current path of the reference cell transistor Ref-CEL, parasite resistance and capacity, and other circuit resistance and capacity RCa-ref and RCb-ref exist. These resistance and capacity values differ depending on the position of the cell transistor in relation to the power supply wiring and ground wiring inside the chip.

The graph in FIG. 2 shows the gate voltage Vg of the cell transistor on the horizontal axis and the drain current Id on the vertical axis. The reference cell transistor Ref-CEL contains: a read verify transistor having a read verify gate voltage/drain current characteristic RV; a program verify transistor having a program verify gate voltage/drain current characteristic PRV; and an erase verify transistor having an erase verify gate voltage/drain current characteristic ERV. A charge is fed into the floating gate of each of these transistors so as to have the corresponding characteristic.

In read operations, the currents of the core cell transistor C-CEL and the read verify reference cell transistor Ref-CEL are compared, and if the core cell transistor is in a programming state of data "0", the drain current becomes smaller than the reference, whereas if the core cell transistor is in an erasure state of data "1", the drain current becomes larger than the reference.

In a program operation that injects a charge into the floating gate of the core cell transistor to change from a data "1" state to a data "0" state, whether or not the characteristic of the core cell transistor during programming C-CEL(P), shown in the drawing by a dotted line, has exceeded the program verify characteristic PRV and moved to the right-hand side of the drawing is detected by comparing the voltage of nodes N1 and N2, which depend on the drain current.

In addition, in an erase operation that extracts a charge from the floating gate of the core cell transistor to change from a data "0" state to a data "1" state, whether or not the characteristic of the core cell transistor during erasure C-CEL(E), shown in the drawing by a dotted line, has exceeded the erase verify characteristic ERV and moved to the left-hand side of the drawing is detected by comparing the voltage of nodes N1 and N2, which depend on the drain current.

However, depending on the location of the core cell transistor C-CEL that is subject to read or verify operations, the resistance/capacity values RCa-c and RCb-c in the current path become bigger or smaller than the corresponding values RCa-ref and RCb-ref in the reference transistor. Then, when a large current is used in a decode operation, output operation or the like during a read operation, variation occurs in the power supply Vcc and Vss levels. Such a power supply variation ordinarily occurs in operations using a large current, but when the above-mentioned resistance/capacity values of both the current paths are different, the effect of the power supply variation on each node N1 and N2 is different, leading to a malfunction in the verify operation.

For example, a malfunction during erase verify will now be explained. Suppose that in terms of the resistance/capacity values of the current path of the power supply Vcc, the core is smaller than the reference (RCa-c<RCa-ref). In this case, if the level of the power supply Vcc temporarily declines due to the use of a large current during a read operation that is in progress at the same time, the node N1, which has a small resistance/capacity value, is more likely to follow the decline of the power supply Vcc than the node N2, and the potential of the node N1 will further decline. For the sense amplifier 14, the reduction in the electric potential of the node N1 means that the drain current of the core cell transistor C-CEL becomes larger. As shown by the arrow C1 in FIG. 2, this phenomenon means that despite the fact that the characteristic of the core cell transistor C-CEL(E) is in a condition of incomplete erasure, positioned on the right-hand side of the characteristic of the erase verify reference cell transistor ERV, the sense amplifier 14 detects it as though it had moved to the left-hand side of the characteristic ERV.

Further, suppose that in terms of the resistance/capacity values of the ground current path, the core is larger than the reference (RCb-c>RCb-ref). In this case, if the ground potential Vss rises due to a read operation that is in progress at the same time, the node N2, which has a small resistance/capacity value, is more likely to follow the rise of the ground potential Vss than the node N1, and the potential of the node N2 will rise further. For the sense amplifier 14, the rise in the electric potential of the node N2 means that the drain current of the reference cell transistor Ref-CEL becomes smaller.

Consequently, as shown by the arrow C2 in FIG. 2, this phenomenon means that despite the fact that it is in a condition of incomplete erasure, the sense amplifier 14 detects it as though the characteristic of the erase verify cell transistor ERV had moved to the right-hand side of the characteristic of the core cell transistor C-CEL(E).

In either of the above cases, despite the fact that erasure is incomplete, the erase verify decision, when a large current has been used by a read operation that is in simultaneous progress, shows erasure as being complete.

A similar mistaken verify decision is triggered in program verify. That is, when RCa-c>RCa-ref, if the power supply Vcc declines due to a read operation, the node N2 follows that power supply reduction even more such that N1>N2, and the drain current Id of the reference cell transistor Ref-CEL becomes even greater, meaning that a characteristic variation has arisen, as shown by the arrow C3 in the drawing.

Further, when RCb-c<RCb-ref, if the ground Vss rises due to a read operation, the node N1 follows this ground rise even more such that N1>N2, and the drain current ID of the core cell transistor C-CEL becomes even smaller, meaning that a characteristic variation has arisen, as shown by the arrow C4 in the drawing.

Accordingly, in program verify, despite the fact that programming is incomplete, the program verify decision, when a large current has been used by a read operation that is in is simultaneous progress, shows programming as being complete.

As described above, mistakes occur in the erase verify and program verify decision results accompanying the use of a large current when a read operation is in simultaneous progress.

SUMMARY OF THE INVENTION

It is therefore an object of the present invention to provide a nonvolatile memory that does not allow mistaken erase verify and program verify decisions to occur.

It is a further object of the present invention to provide nonvolatile memory that is memory for performing read operations and write operations (erase and program) at the same time while preventing the occurrence of mistaken verify decisions in write operations.

In order to achieve the above objectives, one aspect of the present invention is a semiconductor nonvolatile memory in which read operations are carried out during write operations, comprising: a core having a plurality of cell transistors for storing data; and a write verify circuit for detecting change in a core cell transistor's characteristic during a write operation in which the gate voltage/drain current characteristic of the cell transistor is changed to a condition corresponding to stored data by injecting a charge into or extracting a charge from the core cell transistor; and further comprising a write verify inhibition signal generation circuit for generating a write verify inhibition signal in order to deactivate the write verify circuit during a read operation to the core cell transistor.

According to the above invention, the generation of a mistaken verify decision by the write verify circuit, due to a change in the power supply potential accompanying large current during a read operation, is prevented, as is malfunction of the write verify.

In a more preferable embodiment of the above invention, the write verify inhibition signal generation circuit activates a write verify inhibition signal and inhibits decision operations of the write verify circuit when either the address detection signal that detects an address change in a read operation, or the read data output signal that permits output of read data, is in an active state.

In a read operation, particularly during an address decode operation immediately after an address has changed, and during a data output operation performed by a large output transistor having high drive capacity in a data output buffer, a large current flows into the power supply wiring and ground wiring inside the chip, and variation occurs in the power supply and ground potential. Therefore, in the above embodiment, output of a write verify signal is inhibited at least during such a period. The deactivation of this write verify circuit may inhibit the generation of the verify decision result signal itself, or it may inhibit the output of the verify decision-result signal that has been generated.

DESCRIPTION OF THE PREFERRED EMBODIMENTS

Embodiments of the present invention are explained below with reference to the drawings. However, the scope of protection of the present invention is not limited to the following embodiments, but extends to inventions that are specified in the claims and inventions that are equivalent to those specified in the claims.

Figure 3:
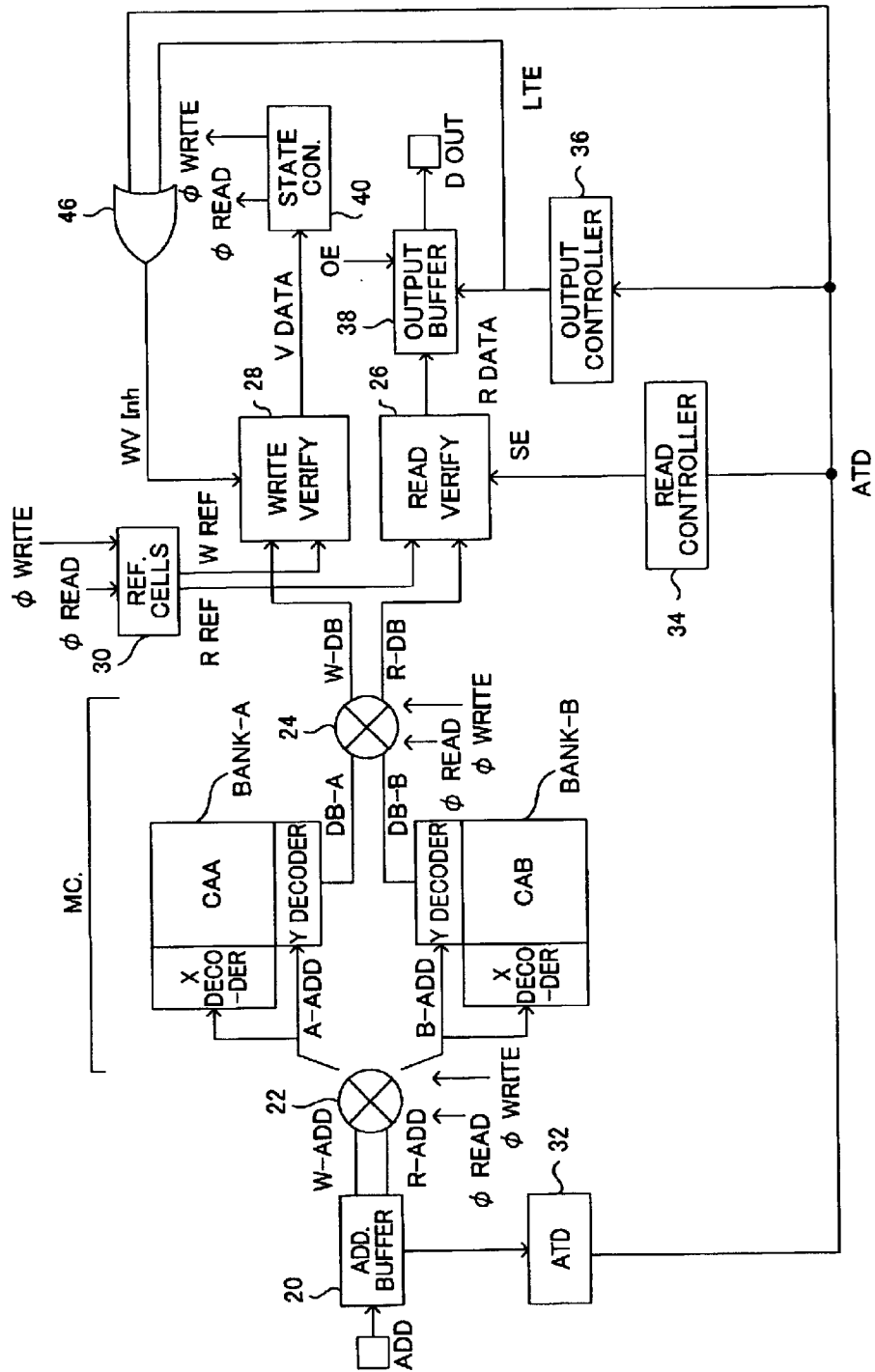
FIG. 3 is a compositional view of the semiconductor nonvolatile memory according to the present embodiment.

FIG. 3 is a construction view of the semiconductor nonvolatile memory according to the present embodiment. The memory circuit consists of a memory core MC having a plurality of cell transistors for storing data, and a peripheral circuit to supply an address to the memory core MC, verify read data, output read data, and control read and write operations.

In the example in FIG. 3, the memory core MC has two memory banks BANK-A and B, and each memory bank has an X decoder to decode line addresses, a Y decoder to decode column addresses, and cell arrays CAA and CAB. When a write operation is in progress in one memory bank, it is possible to carry out a read operation in the other memory bank. The cell transistor inside the cell array injects a charge into or extracts a charge from a floating gate or trap gate, and the gate voltage/drain current characteristic is thereby changed into a condition that corresponds to the data so as to perform writing of the data. Then, reading is performed according to the drain current when a prescribed read gate voltage is applied.

The peripheral circuit has a state controller 40 to control read operations and write operations, and in response to commands supplied from the outside (not shown in the drawings), the state controller 40 outputs a read control signal φRead and a write control signal φWrite to the inside.

In addition, the peripheral circuit contains an address buffer 20 for inputting an external address Add; an address transition detection circuit 32 for detecting an external address change and outputting an address transition signal ATD; switches 22 and 24; a reference cell group 30 having a reference cell transistor group; a write verify circuit 28; a read verify circuit 26; and an output buffer 38 for holding read data RData and outputting it to the outside. Further, in response to the address transition detection signal ATD, a read control circuit 34 generates a sense amplifier activation signal SE in the read verify circuit 26 at a prescribed time. Further, in response to the address transition detection signal ATD, an output control circuit 36 generates a read data output signal LTE that permits the read data RData outputted from the read verify circuit 26 to be taken up by the output buffer circuit 38 and outputted to the outside. Further, an output enable signal OE is supplied to the output buffer 38, and is controlled between a high impedance condition and an output enable condition.

Suppose that the first bank BANK-A in the memory core MC is in the middle of an erase or program write operation, and a read request is generated to the second bank BANK-B. The write address W-Add is supplied to the X and Y decoders of the first bank BANK-A by the switch circuit 22. Then, a pulse for erasure or programming is applied to the cell transistor inside the cell array CAA, and the gate voltage/drain current characteristic is changed. During write verify after application of the pulse, the condition of the core cell transistor is supplied to the write verify circuit 28 through a data bus DB-A, the switch circuit 24, and a write data bus W-DB. Further, the condition of the write verify reference cell transistor inside the reference cell group 30 is also supplied to the write verify circuit 28 during write verify.

As explained with reference to FIG. 1 and FIG. 2, the sense amplifier inside the write verify circuit 28 compares the potential of the first node, which depends on the characteristic of the core cell transistor, with the potential of the second node, which depends on the characteristic of the reference cell transistor, and outputs the high-low relationship of both potentials as verify data VData. During this verify operation, the state controller 40 determines whether it should apply further write pulse to the core cell transistor, or whether it should finish the writing operation, according to the verify data VData generated by the write verify circuit 28.

Meanwhile, when a read request is conducted to the memory bank BANK-B, a read address R-Add is supplied. This read address R-Add is supplied to the X and Y decoders of the memory bank BANK-B via the switch 22. Together with this, a word line identified by the address R-Add is activated, a bit line is connected to a data bus line DB-B, and the potential corresponding to the current of the selected memory cell is outputted to the data bus line DB-B. This potential that has been read is supplied to one input of the sense amplifier inside the read verify circuit 26, through the switch 24 and the read data bus R-DB.

Further, inside the reference cell group 30, a reference cell transistor for reading is selected, and the potential corresponding to that current is supplied to the other input of the sense amplifier inside the read verify circuit 26 as a read reference signal Rref. Then, the read data bus R-DB and the read reference signal Rref are compared by the sense amplifier, and the read data RData is supplied to the output buffer 38.

Figure 1:
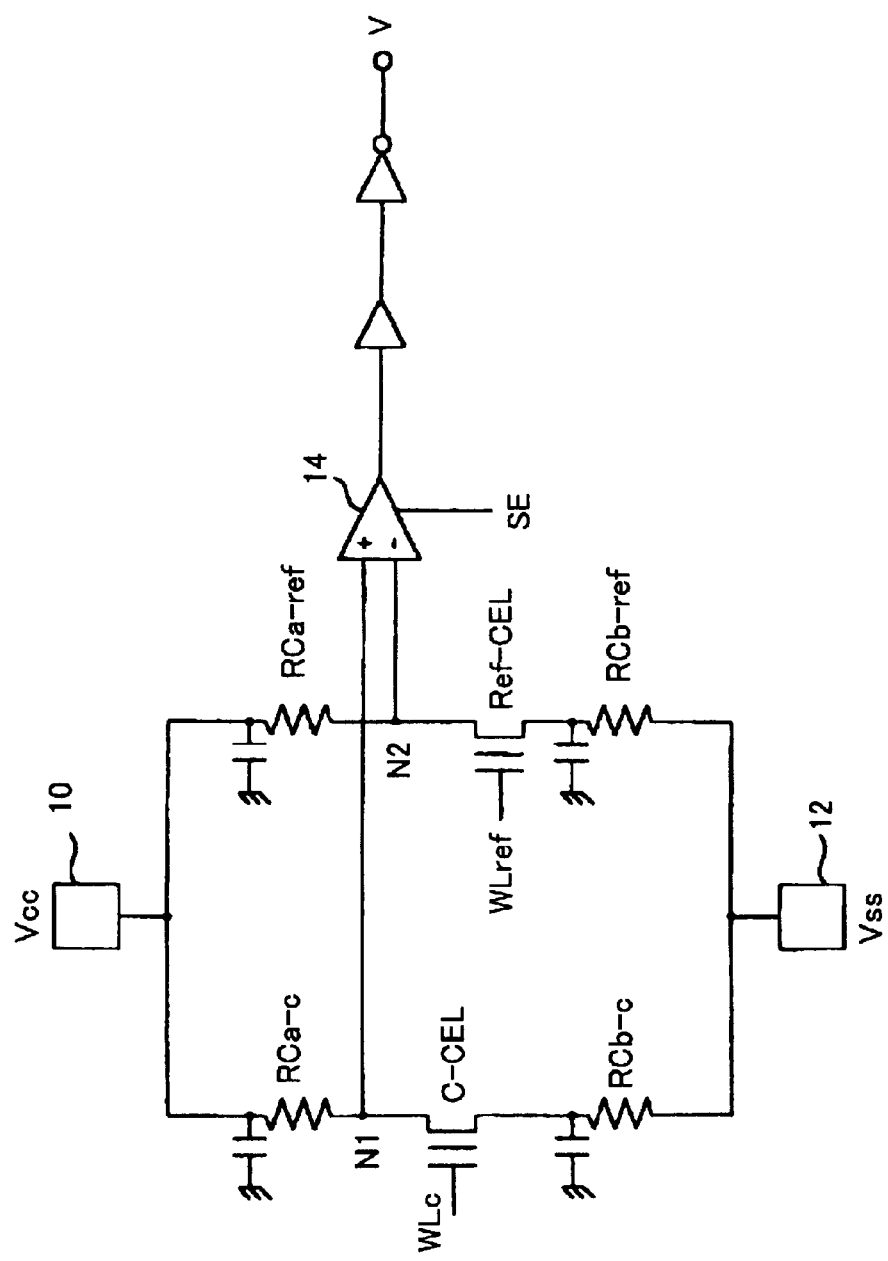
FIG. 1 is a schematic circuit diagram of a core cell transistor, a reference cell transistor, and a sense amplifier.
Figure 2:
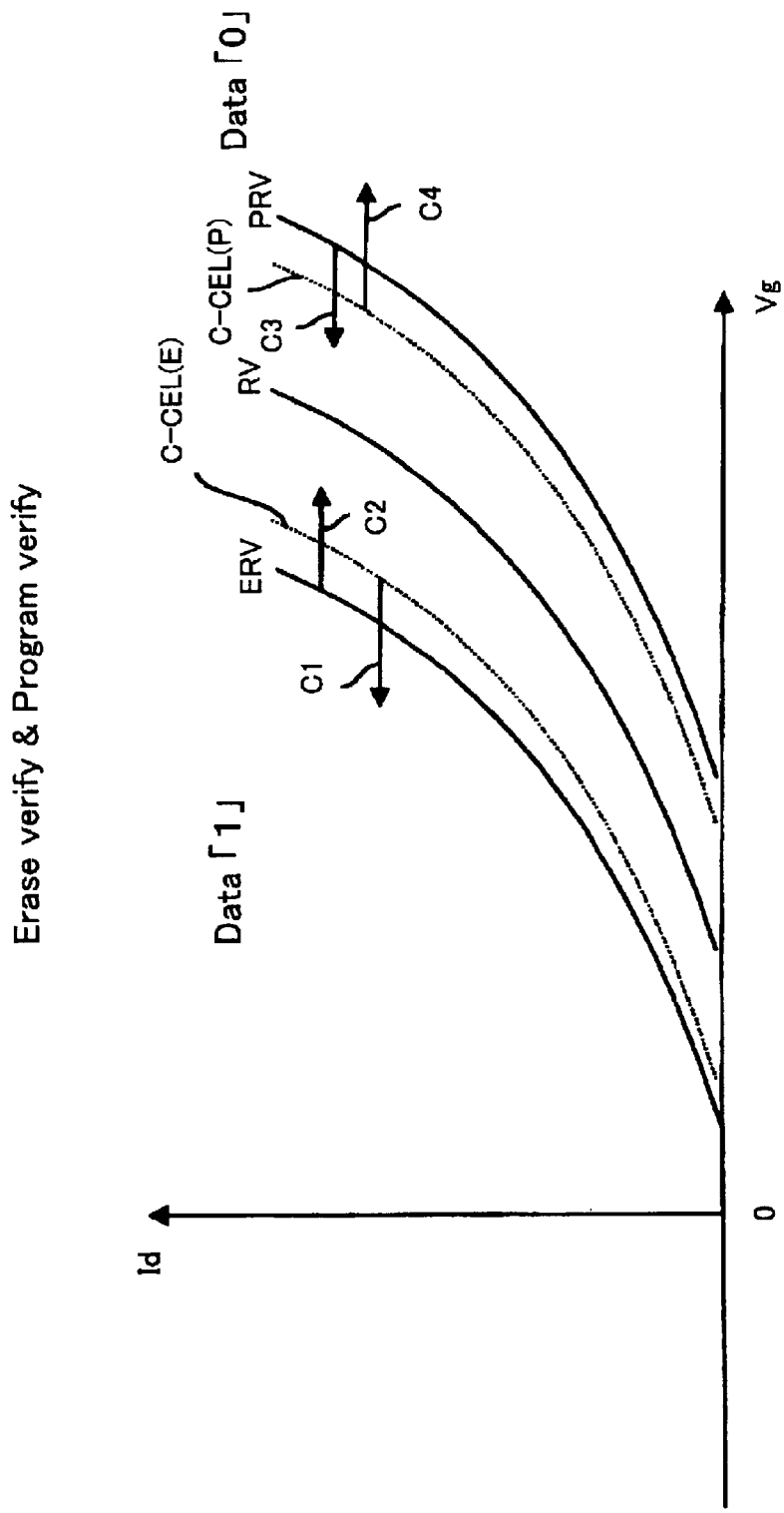
FIG. 2 is a view explaining erase verify and program verify.

The composition of the read verify circuit 26 is as explained in FIG. 1. The gate voltage/drain current characteristic of the reference cell transistor for reading Ref-CEL is positioned between data "0" and "1" as shown by RV in FIG. 2, and the same voltage is applied to that gate as to the core cell transistor gate (word line). Then the voltage of the node N2 corresponding to the drain current of the reference cell transistor Ref-CEL is supplied to the sense amplifier and is compared with the voltage of the node N1 corresponding to the drain current of the core cell transistor C-CEL.

Figure 4:
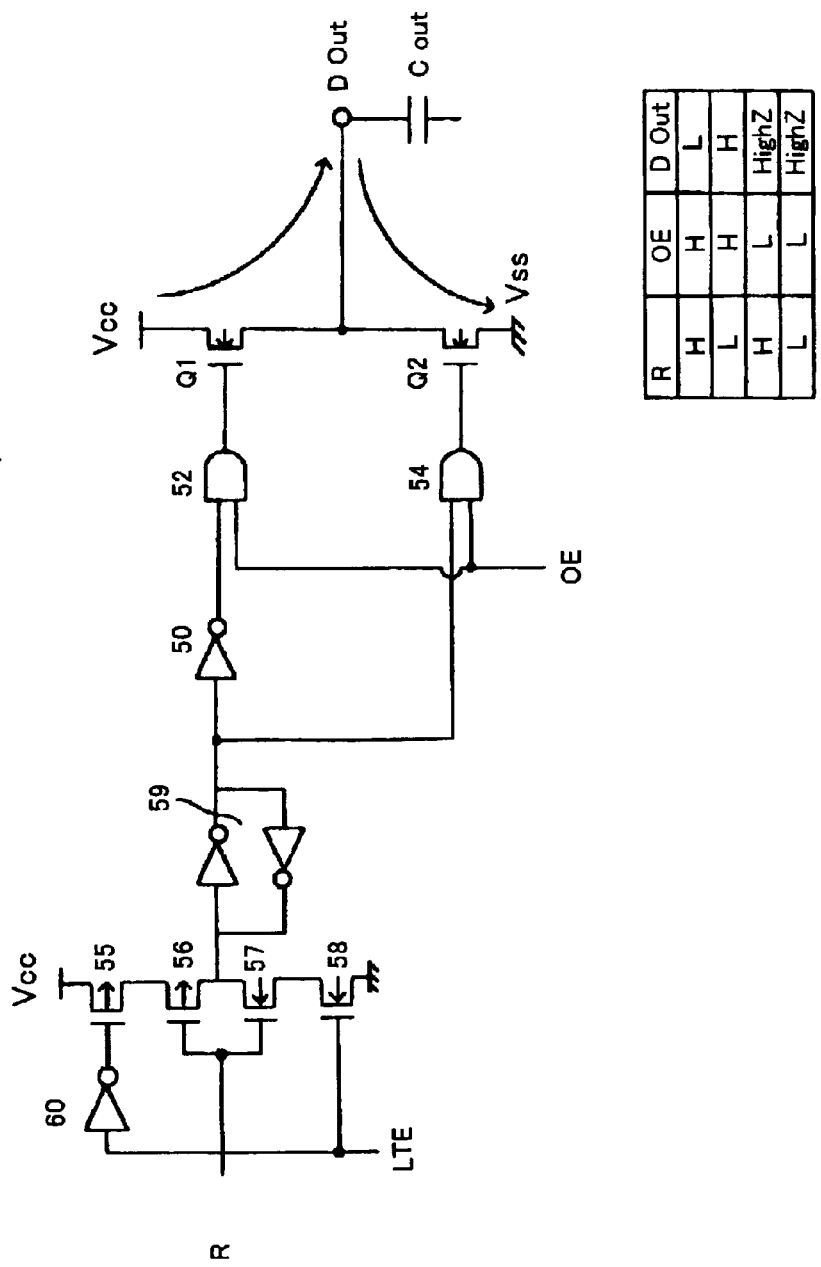
FIG. 4 is a circuit diagram of an output buffer 38.

FIG. 4 is a circuit diagram of the output buffer 38, and its operations are shown on a logical value table. The output buffer 38 has a push-pull circuit between the power supply Vcc and the ground Vss, connecting N channel transistors Q1 and Q2 in series. It also has a latch circuit 59 for holding the read data RData; transistors 55 and 58 in which a read data output signal LTE for taking up the read data RData and controlling the timing of the output transition is inputted into the gate; and transistors 56 and 57, in which read data RData is inputted into the gates, and which are connected in series to each of transistors 55 and 58. The read data RData is supplied to the gate of the transistor Q1 through the transistors 56 and 57, the latch circuit 59, an inverter 50, and an AND gate 52. Further, the read data RData is supplied to the gate of the transistor Q2 through an AND gate 54. An output enable signal OE is supplied to the other input terminals of both AND gates 52 and 54 in order to control whether or not the read data is outputted to the output terminal DOut.

This output buffer 38 performs the following operations. First, when the output enable signal OE is at L level, since the output of the AND gates 52 and 54 also becomes L level regardless of the read data RData, the output transistors Q1 and Q2 both go into a non-conducting condition, and the output terminal DOut goes into a high impedance condition. Further, when the output enable signal OE becomes H level, the inverted signal of the read data RData is supplied to the gate of the transistor Q1, a non-inverted signal is supplied to the gate of the transistor Q2, and the inverted signal of the read data RData is outputted from the output terminal DOut.

When the output enable signal OE is at H level and the read data output signal LTE for controlling the timing of the output transition is at L level, the read data of the previous cycle is held in the latch circuit 59 regardless of the read data RData, and the output terminal DOut is in the same condition as the read data of the previous cycle and does not change. Next, when the read data output signal LTE for controlling the timing of the output transition becomes H level, the transistors 55 and 58 that have inputted this signal LTE into the gate both go into a conductive condition, and the read data RData goes through the transistors 56 and 57, is captured by the latch circuit 59 and is outputted from the output terminal DOut. If the read data RData is data that is inverted from the data of the previous cycle, a large current will be generated in the transistor Q1 or Q2 connected to the output terminal.

In other words, the output transistors Q1 and Q2 of the output buffer 38 are transistors with a comparatively large size and high drive capacity, and during an output operation whereby the read data output signal LTE becomes H level, the large current path shown by an arrow in the drawings is generated. Due to this large current operation, the potential level of the power supply Vcc temporarily declines, or the potential level of the ground Vss temporarily rises.

Figure 5:
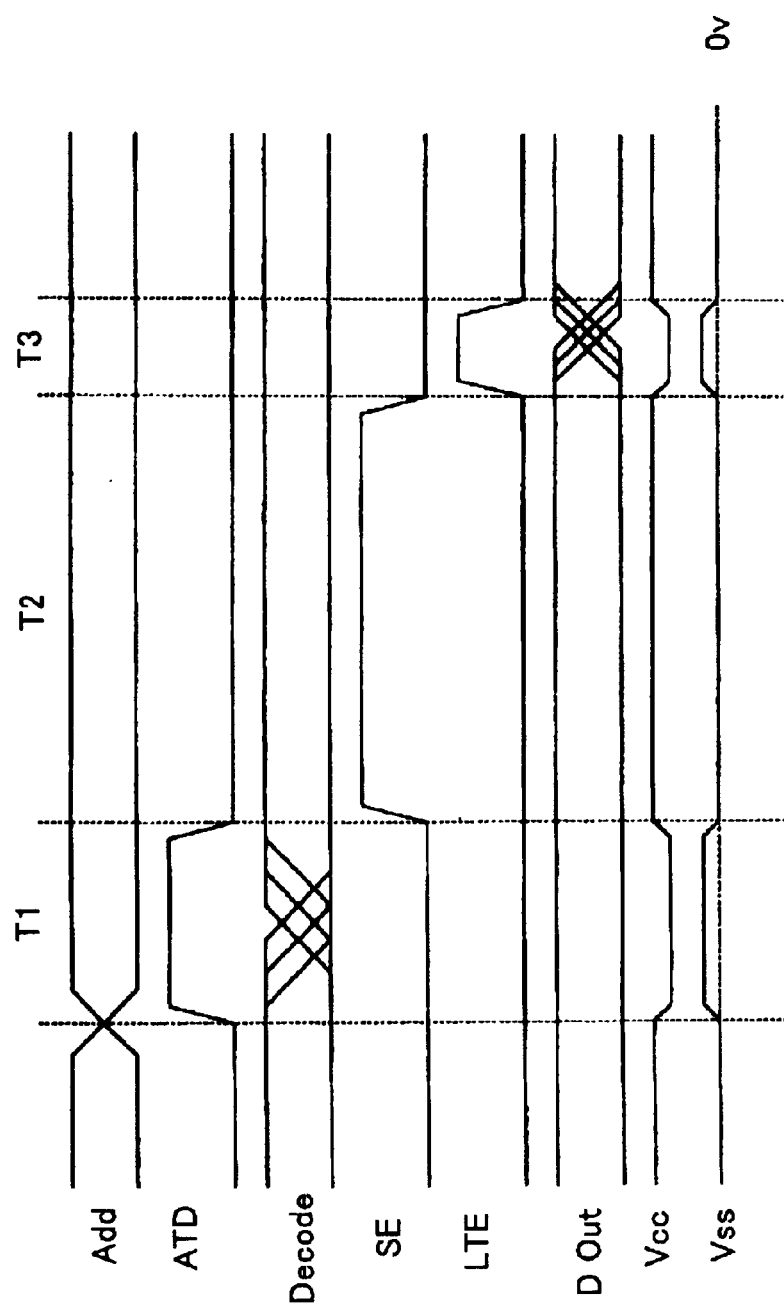
FIG. 5 is a timing chart of a read operation.

FIG. 5 is a timing chart during a read operation. When a change occurs in the address Add from the outside, the change in address is detected by an address transition detection circuit 32, and an address transition detection signal ATD is outputted during a period T1. During this period T1, the address from the outside is supplied to the decoder of the selected bank inside the memory core, and is decoded. In this decode operation, a comparatively large number of address lines are charged and discharged, and a comparatively large number of currents flow to the power supply Vcc and the ground Vss. As a result, as shown in the drawing, during the time period T1, the potential of the power supply Vcc declines and the potential of the ground Vss rises.

In response to the address transition detection signal ATD, during the time period T2, the read control circuit 34 outputs a sense amplifier activation signal SE and activates the sense amplifier (not shown in the drawing) inside the read verify circuit 26. As a result, the detected read data RData is outputted. During the following time period T3, the output control circuit 36 outputs the read data output signal LTE, and the output transistor of the output buffer 38 is operated according to the read data RData. During the time period T3 in which this output buffer 38 operates, a comparatively large current flows to the power supply Vcc and the ground Vss, the potential of the power supply Vcc declines, and the potential of the ground Vss rises.

As explained with reference to FIG. 1 and FIG. 2, the above-mentioned temporary reduction of the power supply Vcc and the temporary increase of the ground Vss lead to malfunctioning of the write verify circuit which is in operation at the same time. Therefore, as shown in FIG. 3, the present embodiment is provided with a write verify inhibition signal generation circuit 46 for generating a write verify inhibition signal WVInh to deactivate the write verify circuit 28 during read operations to the core cell transistor. More specifically, the generation of a verify decision result at the write verify circuit is inhibited by the write verify inhibition signal WVInh. This write verify inhibition signal generation circuit 46 is, for example, an OR gate that takes the logical addition of the address transition detection signal ATD and the read data output signal LTE to generate the write verify inhibition signal WVInh.

Then, when the write verify inhibition signal WVInh has been generated, the generation or output of a verify decision result VData of the write verify circuit 28 is inhibited, preventing a mistaken verify decision from being supplied to the state controller 40. As a result, the mistaken completion of a write operation due to a verify decision malfunction resulting from the reduction of the power supply Vcc and the increase of the ground Vss accompanying a read operation that is in progress at the same time is prevented.

Figure 6:
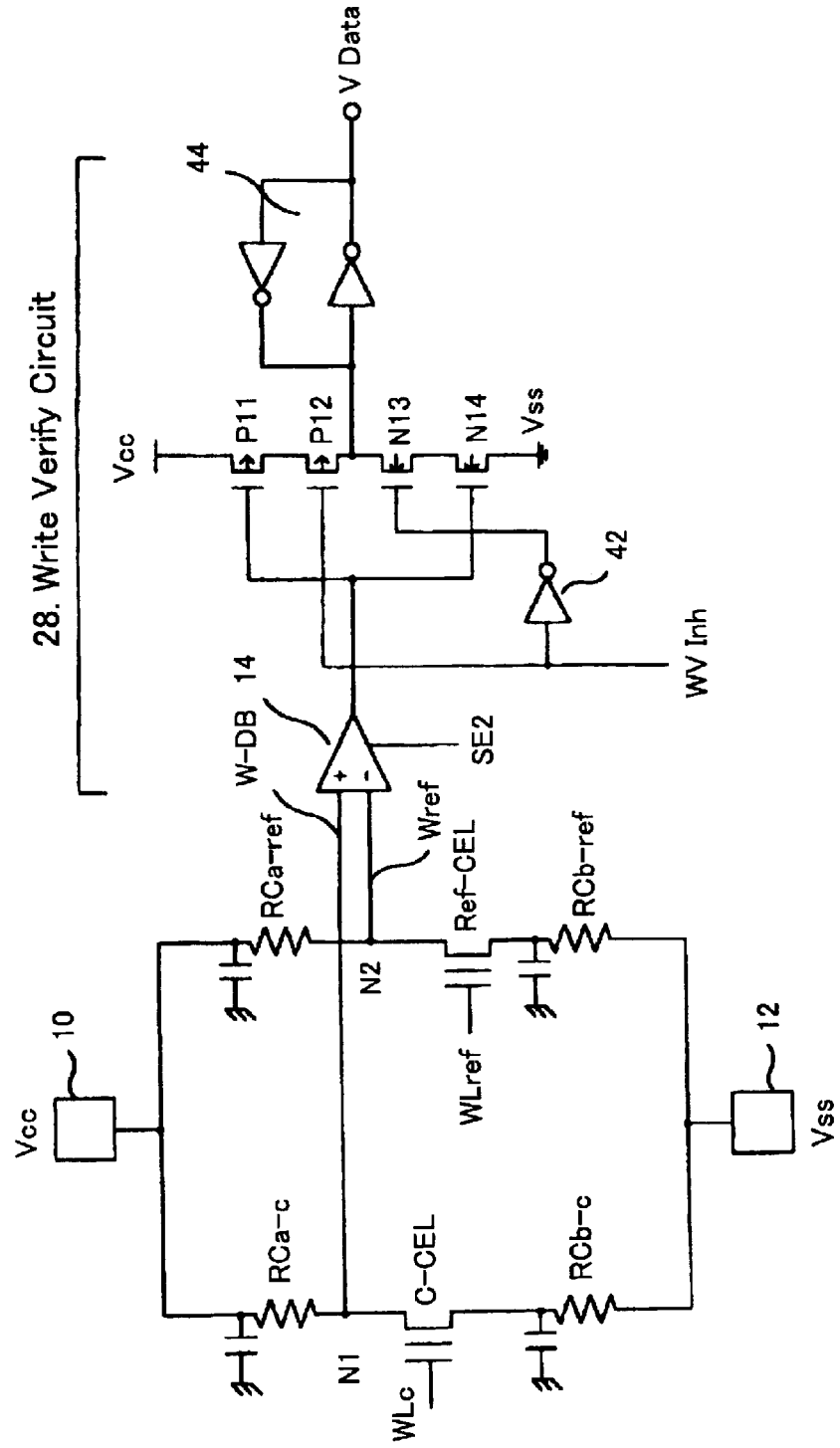
FIG. 6 is a view showing a write verify circuit according to the present embodiment.

FIG. 6 is a view showing a write verify circuit according to the present embodiment. In FIG. 6, as in FIG. 1, the current path of the core cell transistor C-CEL, the current path of the reference cell transistor Ref-CEL, and a sense amplifier 14 that detects the difference in the potential level of the nodes N1 and N2 of these transistors are shown. Further, an inverter circuit to invert the output of the sense amplifier 14 is provided between a latch circuit 44 that cross-connects the two inverters' inputs and outputs, and the sense amplifier 14. The write verify inhibition signal WVInh is supplied to this inverter circuit, and the output of the verify decision result VData is controlled.

In other words, the output of the sense amplifier 14 is supplied to the gates of a P channel transistor P11 and an N channel transistor N14. In addition, the write verify inhibition signal WVInh is supplied to the gate of a P channel transistor P12, and the inverted signal of the inhibition signal WVInh is supplied to the gate of an N channel transistor N13 through an inverter 42. Accordingly, when the write verify inhibition signal becomes H level, the transistors P12 and N13 become non-conducting, the inverter circuit consisting of the transistors P11, P12, N13 and N14 enters a deactivated state, and the supply to the latch circuit 44 of the verify decision result that the sense amplifier 14 outputs is inhibited.

Meanwhile, when the write verify inhibition signal becomes L level, the verify decision result that the sense amplifier 14 outputs is supplied to the latch circuit 44 and latched.

Figure 7:
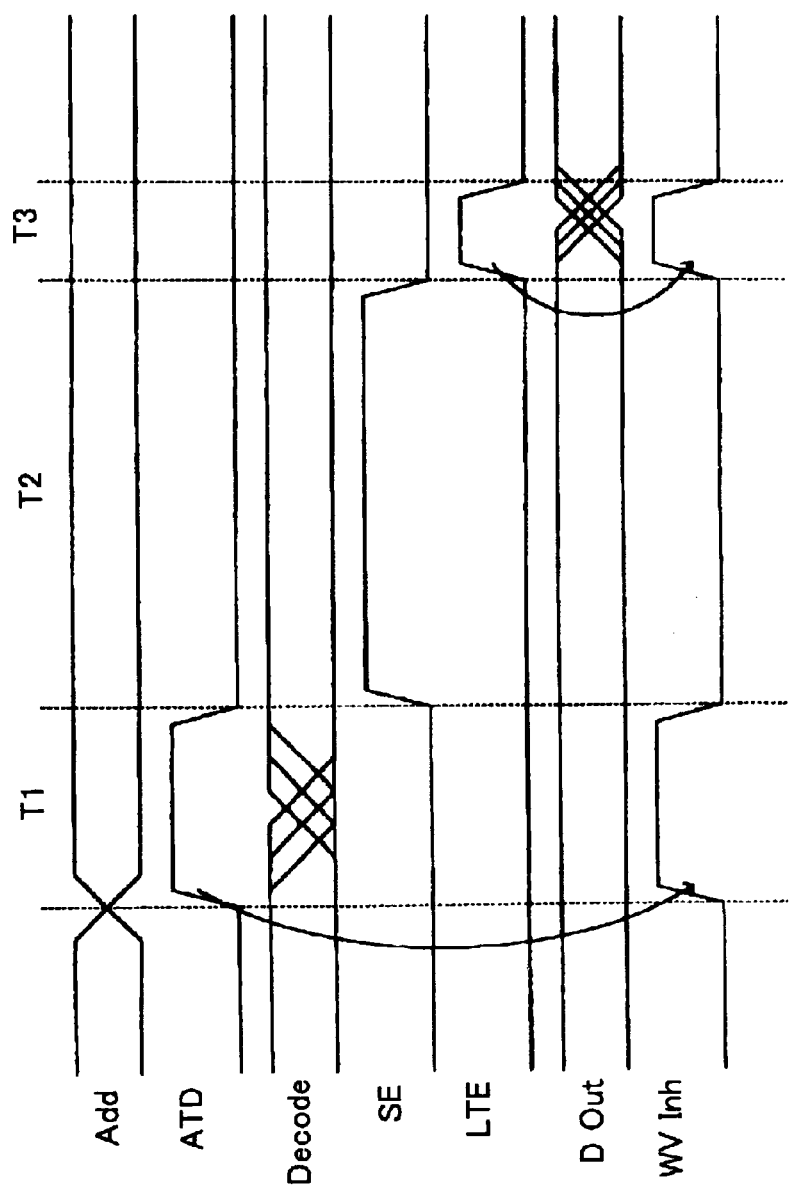
FIG. 7 is a timing chart of a read operation including a write verify inhibition signal.

FIG. 7 is a timing chart of a read operation including a write verify inhibition signal. In the same way as FIG. 5, in response to a change of address Add, an address transition detection signal ATD is generated; during the time period T1, a decoder operates; during the time-period T3 following the operation of the sense amplifier in the read verify circuit 26, the read data output signal LTE becomes H level; and the output buffer 38 operates the output terminal DOut according to the read data RData. During the time period T1 in which the decoder operates, and during the time period T3 in which the output buffer operates, the write verify inhibition signal WVInh becomes H level, and generation of a write verify decision result in the write verify circuit 28 is inhibited.

Accordingly, the verify decision result VData when the write verify inhibition signal WVInh is at H level becomes the previous verify decision result that was held in the latch circuit 44, and the decision result is outputted following this. Therefore, due to the previous verify decision result, the state controller 40 determines the verify decision result to be a fail, and continues the write operation to apply a pulse for writing to the core cell transistor.

In the above-mentioned embodiment, during a write operation that includes erasure or programming, when a read operation is produced, during the period of a decoder operation and output buffer operation, for which a particularly large amount of current is used in a read operation, the write verify inhibition signal WVInh is set to H level, and the decision operation of the write verify circuit 28 is deactivated. Apart from this, if there is a time period during a read operation during which a large current is used, it is desirable that the write verify inhibition signal WVInh is set to H level, and the decision operation of the write verify circuit 28 is made inactive during that period as well, to prevent the generation of a mistaken decision result.

According to the embodiment, since the generation of a verify decision result at the write verify circuit 28 is only temporarily inhibited, if, during that time the write verify goes into a pass state, the verify pass state will be detected for the verify decision after the inhibition period, so there are no negative effects on write operations.

As described above, in a semiconductor nonvolatile memory in which read operations are carried out during write operations, during the period in a read operation when a comparatively large current is used, since the generation of a verify decision result at the write verify circuit is inhibited, the generation of a mistaken verify decision result accompanying variation in the power supply and ground potential is prevented.

What is claimed is:

1. A semiconductor nonvolatile memory, comprising:
a plurality of memory banks each including a plurality of core cell transistors for storing data, wherein during a write operation to one memory bank, a read operation to another memory bank is performed;
a write verify circuit for performing a write verification for detecting change in the characteristic of said core cell transistor during a write operation in which the gate voltage/drain current characteristic of said core cell transistor is changed to a condition corresponding to stored data by injecting or extracting a charge into or from said core cell transistor; and
a write verify inhibition signal generation circuit for generating a write verify inhibition signal in order to deactivate said write verify circuit performing the write verification to the cell transistor of the one memory bank, during at least a part of a read operation to said core cell transistor of the another memory bank.

2. The semiconductor nonvolatile memory according to claim 1, wherein said write verify inhibition signal generation circuit generates said write verify inhibition signal when an address changes in said read operation.

3. The semiconductor nonvolatile memory according to claim 1, wherein each of said memory banks further has a decoder for decoding an address, and said write verify inhibition signal generation circuit generates said write verify inhibition signal when said decoder operates in response to an address change in said read operation.

4. The semiconductor nonvolatile memory according to claim 1, wherein said write verify inhibition signal generation circuit generates said write verify inhibition signal during an output operation by a read data output buffer that outputs read data.

5. The semiconductor nonvolatile memory according to claim 1, wherein said write verify inhibition signal generation circuit generates said write verify inhibition signal in response to an address transition detection signal that detects an address change in said read operation, or a read data output signal that controls the output operations of said read data output buffer that outputs read data.

6. The semiconductor nonvolatile memory according to claim 1, further comprising a reference cell transistor for write verify which has a gate voltage/current characteristic corresponding to the verify level; wherein
said write verify circuit has a sense amplifier for comparing a first voltage corresponding to the drain current of said core cell transistor and a second voltage corresponding to the drain current of said reference cell transistor, and a latch circuit for latching a verify decision result signal that said sense amplifier detects, and wherein
the supply of the output of said sense amplifier to said latch circuit is inhibited in response to said write verify inhibition signal.

7. The semiconductor nonvolatile memory according to claim 1, wherein said gate voltage/drain current characteristic of said core cell transistor is changed by injecting or extracting a charge into or from a floating gate or trap gate.

8. A semiconductor nonvolatile memory, comprising:
a power supply pad and a ground pad to which power supply voltage and ground voltage are supplied, respectively;
a plurality of memory banks each including a plurality of core cell transistors which have gate voltage/drain current characteristic corresponding to stored data, wherein during a write operation to one memory bank, a read operation to another memory bank is performed;
a reference cell transistor for write verify which has gate voltage/drain current characteristic corresponding to the verify level;

a write verify circuit for performing a write verification for detecting change in the characteristic of said core cell transistor by detecting the difference in potential between a first node on a current path connecting said power supply pad, a core cell transistor, and ground pad, and a second node on a current path connecting said power supply pad, reference cell transistor, and ground pad, during a write operation in which the gate voltage/drain current characteristic of said cell transistor is changed to a condition corresponding to stored data by injecting or extracting a charge into or from said core cell transistor; and a write verify inhibition signal generation circuit for generating a write verify inhibition signal in order to deactivate said write verify circuit performing the write verification to the cell transistor of the one memory bank, during at least a part of a read operation to said core cell transistor of the another memory bank.

9. The semiconductor nonvolatile memory according to claim 8, wherein said write verify inhibition signal generation circuit generates said write verify inhibition signal when an address changes in said read operation.

10. The semiconductor nonvolatile memory according to claim 8, wherein each of said memory banks further has a decoder for decoding an address, and said write verify inhibition signal generation circuit generates said write verify inhibition signal when said decoder operates in response to an address change in said read operation.

11. The semiconductor nonvolatile memory according to claim 8, wherein said write verify inhibition signal generation circuit generates said write verify inhibition signal during an output operation by a read data output buffer to output read data.

* * * * *